United States Patent
Ikezaki

(12)
(10) Patent No.: US 6,512,372 B1
(45) Date of Patent: Jan. 28, 2003

(54) MRI APPARATUS WHICH HAS REDUCED GHOST ARTIFACTS DUE TO MAXWELL TERM PHASE ERROR

(75) Inventor: Yoshikazu Ikezaki, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/639,911

(22) Filed: Aug. 16, 2000

(30) Foreign Application Priority Data

Sep. 28, 1999 (JP) .......................................... 11-273880

(51) Int. Cl.$^7$ ................................................ G01N 3/00
(52) U.S. Cl. ........................ 324/312; 324/307; 324/309
(58) Field of Search ................................ 324/312, 318, 324/322, 307, 309

(56) References Cited

U.S. PATENT DOCUMENTS

| | | | |
|---|---|---|---|
| 5,270,654 A | | 12/1993 | Feinberg et al. |
| 5,493,224 A | * | 2/1996 | Shiono et al. ............... 324/309 |
| 5,581,184 A | * | 12/1996 | Heid ............................ 324/309 |
| 5,603,319 A | * | 2/1997 | Kuhara et al. ............... 600/401 |
| 5,810,727 A | | 9/1998 | Groen |
| 5,869,964 A | * | 2/1999 | Kuhara et al. ............... 324/309 |
| 5,877,629 A | * | 3/1999 | King et al. ................... 324/309 |
| 5,917,323 A | * | 6/1999 | Du et al. ..................... 324/306 |
| 5,923,168 A | * | 7/1999 | Zhou et al. .................. 324/307 |
| 5,998,996 A | * | 12/1999 | Bernstein et al. ............ 324/307 |
| 6,043,651 A | * | 3/2000 | Heid ............................ 324/218 |
| 6,064,205 A | * | 5/2000 | Zhou et al. .................. 324/307 |
| 6,127,825 A | * | 10/2000 | Goto ............................ 324/307 |
| 6,188,219 B1 | * | 2/2001 | Reeder et al. ............... 324/307 |
| 6,259,250 B1 | * | 7/2001 | Mock .......................... 324/309 |
| 6,285,187 B1 | * | 9/2001 | Mock .......................... 324/309 |

FOREIGN PATENT DOCUMENTS

| | | |
|---|---|---|
| JP | 11508177 | 7/1990 |
| JP | 7502907 | 3/1995 |

OTHER PUBLICATIONS

Xiaohong Joe Zhou et al "Concomitant Magnetic field induced Artifacts in axial echo planar imaging" Mag. Reson. In Medicine Apr. 1998, vol. 39, No. 4, pp. 596–605.

Ziaohong Joe Zhou etal, Artifacts induced by concomitant magnetic field in fast spin echo imaging, Mag.Resn. in Medicine, Oct. 1998, vol. 40, No. 4, pp. 582–591.

Zhou XJ etal "Concomitant magnetic filed induced artifacts in axial echo planar imaging" Magnetic Resoance in Medicine, Academic Press, Duluth MN vol. 39, No. 4 Apr. 1, 1998*

* cited by examiner

Primary Examiner—Edward Lefkowitz
Assistant Examiner—Dixomara Vargas
(74) Attorney, Agent, or Firm—Moonray Kojima

(57) ABSTRACT

In order to reduce ghost artifacts due to a Maxwell term phase error caused by a data acquisition read gradient, an n-th Maxwell term collection pulse $MTCP_n$ is appended before an inversion RF pulse RF180 for an n-th shot in an I-echo N-shot EPI pulse sequence. The n-th Maxwell term collection pulse $MTCP_n$ has a waveform whose time integral value is zero, and gives a bias phase error such that a Maxwell term phase error which is caused by a data acquisition read gradient and contained in data filling out a k-space smoothly varies from a $1^{st}$ row to an N·I-th row in the direction of a phase encoding axis.

12 Claims, 12 Drawing Sheets

MRI APPARATUS WHICH HAS REDUCED GHOST ARTIFACTS DUE TO MAXWELL TERM PHASE ERROR

BACKGROUND OF THE INVENTION

The present invention relates to an MRI (magnetic resonance imaging) apparatus, and more particularly to an MRI apparatus that can reduce ghost artifacts due to a Maxwell term phase error caused by a data acquisition read gradient.

FIG. 6 shows an exemplary pulse sequence in accordance with an EPI (echo planar imaging) technique.

In this pulse sequence, an excitation pulse RF90 and a slice gradient SG90 are applied. Subsequently, a phase encoding gradient $P_{n1}$ is applied. Next, an inversion RF pulse RF180 and a slice gradient SG180 are applied. Then, an alternating data acquisition read gradient $r_1, \ldots, r_I$ (I=4 in FIG. 6) having positive and negative polarities is consecutively applied, and at the same time, phase encoding gradients $P_2, \ldots, P_I$ are applied to sample $1^{st}$ through I-th echoes $e_1$–$e_I$ synchronously with sequential focusing of the $1^{st}$ through I-th echoes, thereby collecting data $d_{n1}, \ldots, d_{nI}$ corresponding to the echoes $e_1$–$e_I$. This sequence is repeated for n=1, ..., N, and data $d_{11}$–$d_{NI}$ filling out a k-space are collected. This is referred to as an N-shot·I-echo process.

FIG. 7 is a schematic diagram illustrating a trajectory of collecting the data $d_{11}$–$d_{NI}$ in a k-space KS, wherein N=4 and I=4.

When the k-space KS is divided into $1^{st}$ through N·I-th rows (16 rows in FIG. 6) in the direction of a phase encoding axis, phase encodings $P_{n1}, P_2, \ldots, P_I$ are applied so that data $d_{ni}$ for an (n+(i–1) N)-th row is collected by an i-th echo in an n-th shot.

Referring to FIG. 8, the k-space KS can be sequentially divided into a $1^{st}$ echo block, which is filled with data $d_{n1}$ acquired from a $1^{st}$ echo in each shot, through an I-th echo block (I=4 in FIG. 6), which is filled with data $d_{nI}$ acquired from an I-th echo in each shot.

FIG. 9 is a diagram illustrating a phase error due to magnetic field inhomogeneity of a magnet.

The phase error due to magnetic field inhomogeneity increases in proportion to the time period from the excitation pulse RF90, as indicated by a magnetic field inhomogeneity phase error characteristic line.

If the time period from the excitation pulse RF90 to the beginning of application of the data acquisition read gradient is the same among all the shots, all the data $d_{ni}$ corresponding to i-th echoes $e_i$ have a phase error magnitude of $U_i$. Accordingly, the phase error exhibits a large stepped difference between the adjacent echo blocks, resulting in ghost artifacts.

Therefore, as shown in FIG. 10, the time period from the excitation pulse RF90 to the beginning of application of the data acquisition read gradient is sequentially delayed from a $2^{nd}$ shot to an N-th shot by a delay time of 1/N an echo space (an echo space=a time period between the adjacent echoes=a time width of a read gradient corresponding to one echo). This technique is referred to as echo shift. The magnitude of phase error now changes linearly in the direction of the phase encoding axis in the k-space KS and does not exhibit the large stepped difference in the phase error between the adjacent echo blocks. The ghost artifacts can thus be reduced.

FIG. 12 shows an exemplary pulse sequence in accordance with a GRASE (gradient and spin echo) technique.

In this pulse sequence, an excitation pulse RF90 and a slice gradient SG90 are applied. Subsequently, a read gradient $r_0$ is applied. Next, a j-th inversion RF pulse RF180_j (j=1, ..., J. In FIG. 12, J=3) and a slice gradient SG180 are applied. Then, an alternating data acquisition read gradient $r_{j1}, \ldots, r_{jI}$ (I=3 in FIG. 12) having positive and negative polarities is consecutively applied, and at the same time, phase encoding gradients $p_{j1}, \ldots, p_{jI}$ are applied to sample $1^{st}$ through I-th echoes for the j-th inversion RF pulse $e_{j1}$–$e_{jI}$ synchronously with sequential focusing of the $1^{st}$ through I-th echoes, thereby collecting data $d_{nj1}, \ldots, d_{njI}$ corresponding to the echoes $e_{j1}$–$e_{jI}$. This sequence is repeated for n=1, ..., N, and data $d_{111}$–$d_{NJI}$ filling out a k-space are collected.

FIG. 13 is a schematic diagram illustrating a trajectory of collecting the data $d_{111}$–$d_{NJI}$ in a k-space KS, wherein N=2, J=3 and I=3.

When the k-space KS is divided into $1^{st}$ through N·J·I-th rows (18 rows in FIG. 13) in the direction of a phase encoding axis, a phase encoding $p_{ji}$ for an n-th shot is applied so that data $d_{nji}$ for an (n+(i–1) N+(i–1) N·J)-th row is collected by an i-th echo for a j-th inversion pulse in an n-th shot.

Also in the GRASE pulse sequence shown in FIGS. 12 and 13, ghost artifacts can be reduced by applying echo shift similarly to the EPI technique.

In the past, ghost artifacts due to a phase error caused by magnetic field inhomogeneity are thus reduced by the echo shift.

However, mere echo shift cannot fully reduce ghost artifacts because the conventional techniques have not accounted for ghost artifacts due to a phase error from a Maxwell term (which will be described in more detail later) caused by a data acquisition read gradient.

SUMMARY OF THE INVENTION

It is an object of the present invention to provide an MRI apparatus that can reduce ghost artifacts due to a Maxwell term phase error caused by a data acquisition read gradient.

In accordance with a first aspect of the invention, there is provided an MRI apparatus comprising pulse sequence generating means for generating a pulse sequence for collecting data, data collecting means for executing the generated pulse sequence to collect data, and image producing means for reconstructing an image from the collected data, wherein the pulse sequence generating means generates a pulse sequence for an n-th shot so that the following conditions are satisfied: (1) when a k-space is divided into $1^{st}$ through N·I-th rows (wherein N and I are natural numbers not less than 2) in the direction of a phase encoding axis, repeating for N shots a pulse sequence which applies a data acquisition read gradient while inverting the gradient to focus I echoes per inversion RF pulse, and collecting data for filling out the k-space; and (2) appending an n-th Maxwell term correction read pulse before an inversion RF pulse in an n-th shot (wherein n=1–N), the n-th Maxwell term correction read pulse having a waveform whose time integral value is zero, and giving a bias phase error such that a Maxwell term phase error which is caused by the data acquisition read gradient and contained in the data filling out the k-space smoothly varies from the $1^{st}$ row to the N·I-th row in the direction of the phase encoding axis (including, in a case of a shot taken as a reference, appending no Maxwell term correction read pulse only to that shot).

In other words, the present invention provides an MR imaging method for, when a k-space is divided into $1^{st}$ through N·I-th rows (wherein N and I are natural numbers not less than 2) in the direction of a phase encoding axis, repeating for N shots a pulse sequence which applies a data acquisition read gradient while inverting the gradient to focus I echoes per inversion RF pulse, and collecting data for filling out the k-space, the method comprising the step of: appending an n-th Maxwell term correction read pulse before an inversion RF pulse in an n-th shot (wherein n=1–N), the n-th Maxwell term correction read pulse having a waveform whose time integral value is zero, and giving a bias phase error such that a Maxwell term phase error which is caused by the data acquisition read gradient and contained in the data filling out the k-space smoothly varies from the $1^{st}$ row to the N·I-th row in the direction of the phase encoding axis (including, in a case of a shot taken as a reference, appending no Maxwell term correction read pulse only to that shot).

If a main magnet field is $B_0$, and linear gradient magnetic fields in the X-, Y- and Z-directions are $G_x$, $G_y$ and $G_z$, a magnetic field $B_z(x, y, z, t)$ at a point $(x, y, z)$ and at a time $(t)$ can ideally be given by:

$$B_z(x,y,z,t)=B_0+G_x(t)\cdot x+G_y(t)\cdot y+G_z(t)\cdot z.$$

In practice, the magnet field $B_z(x, y, z, t)$ contains an additional term $B_M(x, y, z, t)$ so that a Maxwell equation is satisfied:

$$B_z(x,y,z,t)=B_0+G_x(t)\cdot x+G_y(t)\cdot y+G_z(t)\cdot z+B_M(x,y,z,t).$$

The additional term $B_M$ is referred to as a Maxwell term and is given by:

$$B_M = \frac{G_z^2 x^2}{8B_0} + \frac{G_z^2 y^2}{8B_0} + \frac{(G_x^2 + G_y^2)z^2}{2B_0} - \frac{G_y G_z yz}{2B_0} - \frac{G_x G_z xz}{2B_0}, \quad (1)$$

wherein the Z-direction is defined as a main magnet field direction.

Assume that the slice axis corresponds to the Y-direction, the read axis to the X-direction and the phase encoding axis to the Z-direction. Since the third term in Equation (1) is predominant, a phase error $\phi_M$ from the Maxwell term $B_M$ caused by the data acquisition read gradient is given by:

$$\phi_M = \frac{\gamma Z^2}{2B_0} \int_0^\tau G_x^2(t)\,dt, \quad (2)$$

wherein t=0 at the beginning time of application of the read gradient.

As demonstrated by Equation (2), the phase error from the Maxwell term caused by the data acquisition read gradient increases in proportion to the time period from the beginning of application of the data acquisition read gradient. This is indicated by a Maxwell term phase error characteristic line in the EPI technique, shown in FIG. 11. Since the beginning time of application of the read gradient is shifted among the shots by echo shift, the Maxwell term phase error characteristic line is also shifted among the shots.

As can be seen from FIG. 11, the Maxwell term phase error caused by a data acquisition read gradient for data $d_{ni}$ corresponding to an i-th echo $e_i$ in an n-th shot has a magnitude of $M_i$ in an i-th echo block. Hence, the phase error exhibits a large stepped difference between the adjacent echo blocks, resulting in ghost artifacts.

Therefore, according to the MRI apparatus of the first aspect, an n-th Maxwell term correction pulse is appended before an inversion RF pulse in an n-th shot. The n-th Maxwell term correction pulse does not affect the phase encoding amount because of its waveform having a time integral value of zero. The Maxwell term phase error still has a fixed amount. Moreover, the amount gives a bias phase error such that a Maxwell term phase error which is caused by a data acquisition read gradient and contained in data filling out the k-space smoothly varies from a $1_{st}$ row to an N·I-th row in the direction of a phase encoding axis. Thus, the Maxwell term phase error caused by the data acquisition read gradient does not exhibit a large stepped difference between the adjacent echo blocks, and ghost artifacts can be reduced.

In accordance with a second aspect of the invention, there is provided an MRI apparatus comprising pulse sequence generating means for generating a pulse sequence for collecting data, data collecting means for executing the generated pulse sequence to collect data, and image producing means for reconstructing an image from the collected data, wherein the pulse sequence generating means generates a pulse sequence for an n-th shot so that the following conditions are satisfied: (1) when a k-space is divided into $1^{st}$ through N·J·I-th rows (wherein N is a natural number not less than 1, and J and I are natural numbers not less than 2) in the direction of a phase encoding axis, repeating for N shots a pulse sequence which applies J inversion RF pulses per excitation RF pulse and applies a data acquisition read gradient while inverting the gradient to focus I echoes per inversion RF pulse, and collecting data for filling out the k-space; and (2) appending an nj-th Maxwell term correction read pulse before or after a j-th inversion RF pulse (wherein j=1–J) in an n-th shot (wherein n=1–N), the nj-th Maxwell term correction read pulse having a waveform whose time integral value is zero, and giving a bias phase error such that a Maxwell term phase error which is caused by the data acquisition read gradient and contained in the data filling out the k-space smoothly varies from the $1^{st}$ row to the N·J·I-th row in the direction of the phase encoding axis (including, in a case of a shot taken as a reference, appending no Maxwell term correction read pulse only to that shot).

In other words, the present invention provides an MR imaging method for, when a k-space is divided into $1^{st}$ through N·J·I-th rows (wherein N is a natural number not less than 1, and J and I are natural numbers not less than 2) in the direction of a phase encoding axis, repeating for N shots a pulse sequence which applies J inversion RF pulses per excitation RF pulse and applies a data acquisition read gradient while inverting the gradient to focus I echoes per inversion RF pulse, and collecting data for filling out the k-space, the method comprising the step of: appending an nj-th Maxwell term correction read pulse before or after a j-th inversion RF pulse (wherein j=1–J) in an n-th shot (wherein n=1–N), the nj-th Maxwell term correction read pulse having a waveform whose time integral value is zero, and giving a bias phase error such that a Maxwell term phase error which is caused by the data acquisition read gradient and contained in the data filling out the k-space smoothly varies from the $1^{st}$ row to the N·J·I-th row in the direction of the phase encoding axis (including, in a case of a shot taken as a reference, appending no Maxwell term correction read pulse only to that shot).

FIG. 14 illustrates a Maxwell term phase error characteristic in the GRASE technique, wherein N=1, J=3 and I=3.

As can be seen from FIG. 14, the Maxwell term phase error caused by a data acquisition read gradient for data $d_{ji}$ corresponding to an i-th echo $e_{ji}$ for a j-th inversion pulse RF180_i in an n-th shot has a magnitude of $M_i$ in an i-th echo block. Hence, the phase error exhibits a large stepped difference between the adjacent echo blocks, resulting in ghost artifacts.

Therefore, according to the MRI apparatus of the second aspect, an nj-th Maxwell term correction pulse is appended before or after a j-th inversion RF pulse in an n-th shot. The nj-th Maxwell term correction pulse does not affect the phase encoding amount because of its waveform having a time integral value of zero. The Maxwell term phase error still has a fixed amount. Moreover, the amount gives a bias phase error such that a Maxwell term phase error which is caused by a data acquisition read gradient and contained in data filling out the k-space smoothly varies from a $1^{st}$ row to an N·J·I-th row in the direction of a phase encoding axis. Thus, the Maxwell term phase error caused by the data acquisition read gradient does not exhibit a large stepped difference between the adjacent echo blocks, and ghost artifacts can be reduced.

In accordance with a third aspect of the invention, there is provided the MRI apparatus as described regarding the first or second aspect, wherein the pulse sequence generating means generates a pulse sequence for an n-th shot so that the following condition is also satisfied: (3) appending the Maxwell term correction read pulse such that a Maxwell term phase error which is caused by the data acquisition read gradient and contained in data of, or proximate to, a DC component in the k-space is equal to, or proximate to, zero.

In the MRI apparatus of the third aspect, since a Maxwell term phase error which is caused by a data acquisition read gradient and contained in data of, or proximate to, a DC component, the most important to image reconstruction, in the k-space is equal to, or proximate to, zero, the effect of the Maxwell term phase error caused by the data acquisition read gradient on an image can be reduced to a minimum.

Thus, the MRI apparatus of the present invention can reduce ghost artifacts due to a Maxwell term phase error caused by a data acquisition read gradient.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments shown in the accompanying drawings.

First Embodiment

Figure 1:
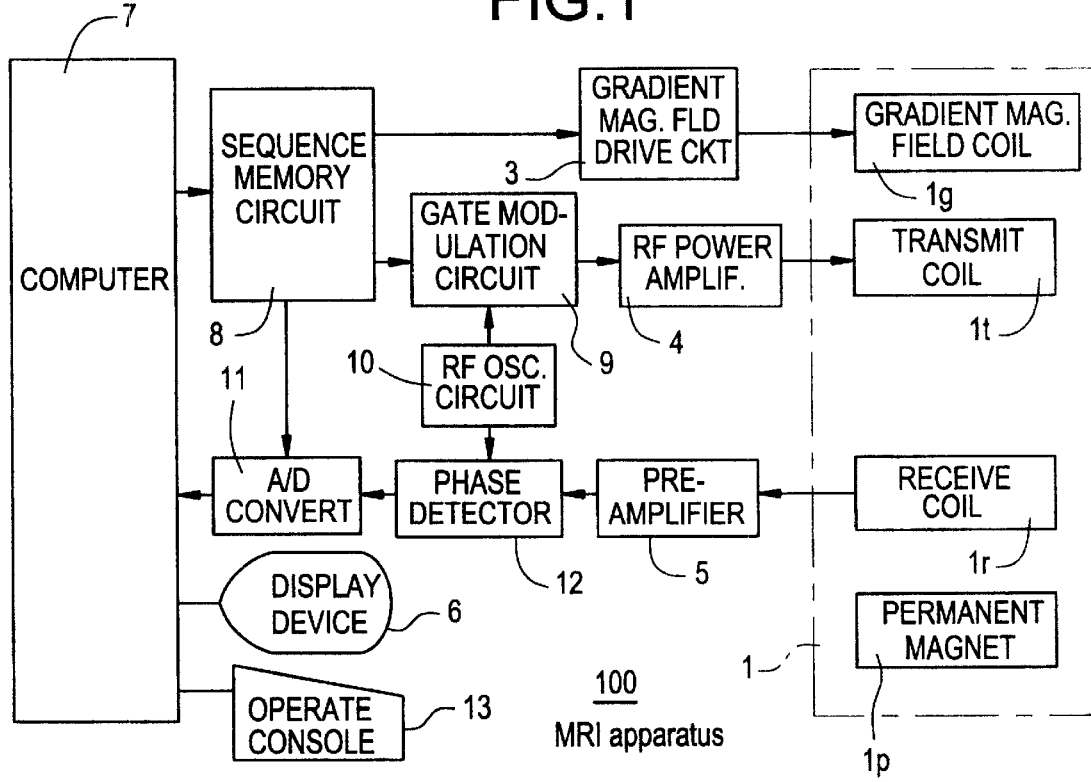
FIG. 1 is a block diagram of an MRI apparatus in accordance with a first embodiment of the invention.

FIG. 1 is a block diagram of an MRI apparatus in accordance with one embodiment of the present invention.

The MRI apparatus 100 comprises a magnet assembly 1 having therein an empty portion (bore) for inserting a subject, and surrounding the empty portion are disposed a permanent magnet 1p for applying a constant main magnetic field to the subject, a gradient magnetic field coil 1g for applying gradient magnetic fields (the gradient magnetic field coil includes x-axis, y-axis and z-axis coils, and the slice, read and phase encoding axes are determined by combination of the coils), a transmit coil 1t for transmitting an RF pulse to excite spins of atomic nuclei within the subject, a receive coil 1r for detecting an NMR signal from the subject, and so forth. The gradient magnetic field coil 1g, transmit coil 1t and receive coil 1r are connected to a gradient magnetic field drive circuit 3, an RF power amplifier 4 and a preamplifier 5, respectively. It should be noted that a superconductive magnet may be employed instead of the permanent magnet 1p.

A computer 7 generates a pulse sequence, and passes the sequence to a sequence memory circuit 8.

The sequence memory circuit 8 stores the pulse sequence, and operates the gradient magnetic field drive circuit 3 based on the stored pulse sequence to generate the gradient magnetic fields from the gradient magnetic field coil 1g in the magnet assembly 1. The sequence memory circuit 8 also operates a gate modulation circuit 9 to modulate a carrier output signal from an RF oscillation circuit 10 into a pulsed signal having a lo certain timing and envelope shape. The pulsed signal is applied as an RF pulse to the RF power amplifier 4, power-amplified in the RF power amplifier 4, and applied to the transmit coil it in the magnet assembly 1.

The preamplifier 5 amplifies an NMR signal received at the receive coil 1r in the magnet assembly 1, and inputs the signal to a phase detector 12. The phase detector 12 phase-detects the NMR signal with reference to the carrier output signal from the RF oscillation circuit 10, and supplies the phase-detected signal to an AND converter 11. The A/D converter 11 converts the analog NMR signal into digital signal data, and inputs it to the computer 7.

The computer 7 reads the data from the A/D converter 11, and performs an image reconstruction operation to produce an image. The image is displayed on a display device 6.

The computer 7 is also responsible for overall control such as receiving information input from an operator console 13.

Figure 2:
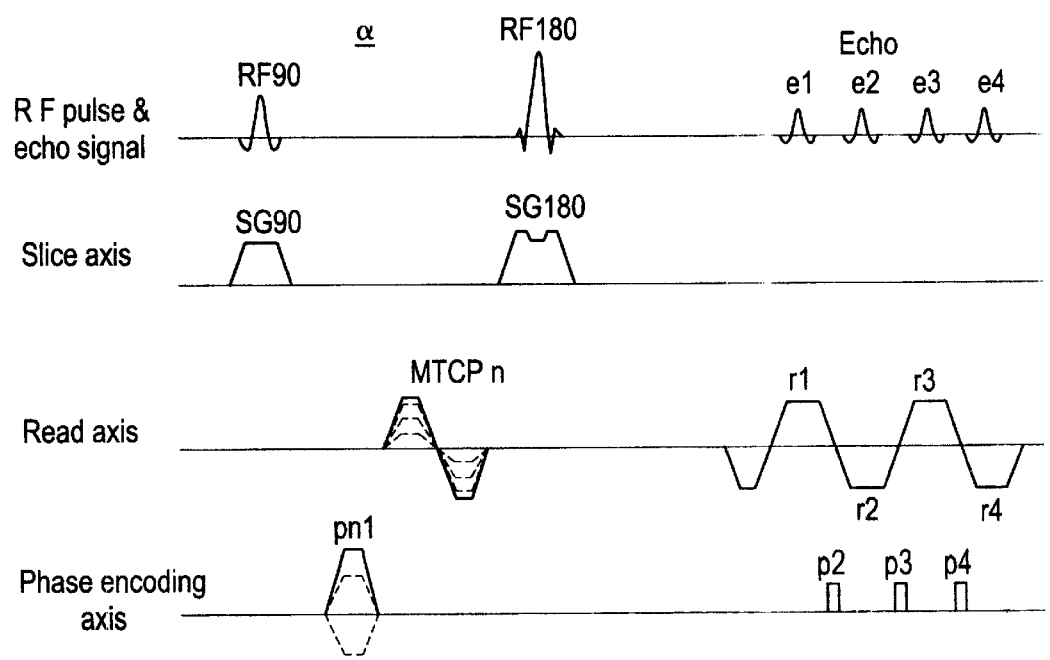
FIG. 2 is a pulse sequence chart of an EPI technique in accordance with the first embodiment.

FIG. 2 is a pulse sequence chart of an EPI technique in accordance with a first embodiment of the present invention.

The EPI pulse sequence a is generated by the computer 7 so that the following conditions are satisfied:

(1) when a k-space is divided into $1^{st}$ through $16^{th}$ rows in the direction of a phase encoding axis, repeating for 4 shots a 4-echo EPI pulse sequence which applies a data acquisition read gradient $r_1$–$r_4$ while inverting the gradient to focus 4 echoes per inversion RF pulse, and collecting data $d_{ni}$ for an $(n+(i-1)\cdot 4)$-th row by an i-th echo (i=1–4) in an n-th shot (n=1–4);

(2) applying echo shift for shifting the beginning time of application of the data acquisition read gradient in each shot; and (3) appending an n-th Maxwell term correction read pulse $MTCP_n$ before an inversion RF pulse RF180 in an n-th shot, the n-th Maxwell term correction read pulse $MTCP_n$ having a waveform whose time integral value is zero, and giving a bias phase error such that a Maxwell term phase error which is caused by the data acquisition read gradient and contained in the data $d_{ni}$ filling out the k-space KS smoothly varies from the $1^{st}$ row to the $16^{th}$ row in the direction of the phase encoding axis.

Figure 3:
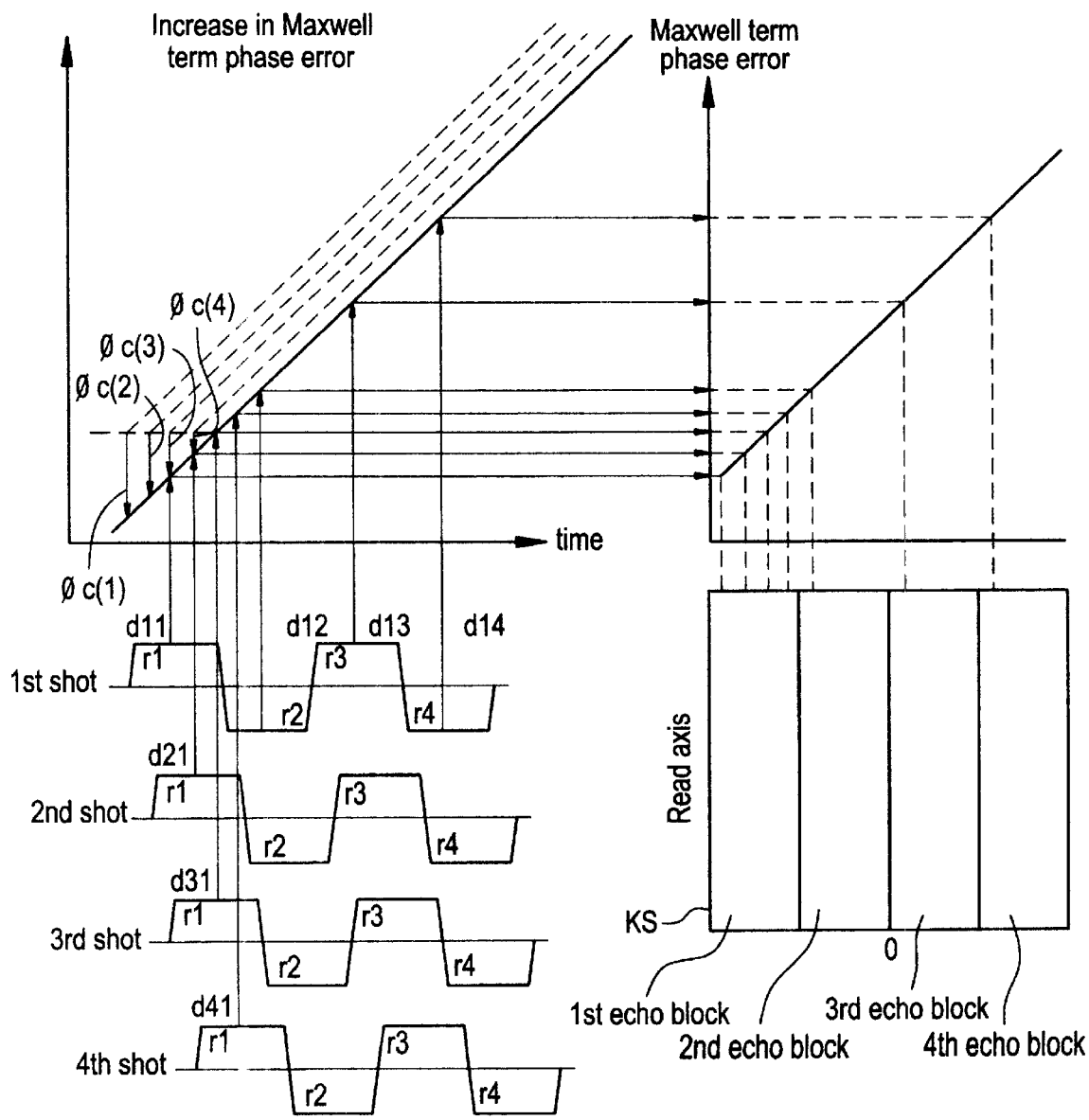
FIG. 3 is a diagram illustrating a Maxwell term phase error characteristic caused by a data acquisition read gradient in accordance with the first embodiment.

FIG. 3 is a diagram illustrating the Maxwell term phase error which is caused by the data acquisition read gradient and contained in the data $d_{ni}$ obtained by the EPI pulse sequence of the first embodiment.

By appending a $1^{st}$ Maxwell term correction read pulse $MTCP_1$, a characteristic line of a Maxwell term phase error in a $1^{st}$ shot is lowered by a bias phase error $\phi_c(1)$ relative to the characteristic line without the Maxwell term correction read pulse, and is made to match a standard Maxwell term phase error characteristic line.

By appending a $2^{nd}$ Maxwell term correction read pulse $MTCP_2$, a characteristic line of a Maxwell term phase error in a $2^{nd}$ shot is lowered by a bias phase error $\phi_c(2)$ relative to the characteristic line without the Maxwell term correction read pulse, and is made to match the standard Maxwell term phase error characteristic line.

By appending a $3^{rd}$ Maxwell term correction read pulse $MTCP_3$, a characteristic line of a Maxwell term phase error in a $3^{rd}$ shot is lowered by a bias phase error $\phi_c(3)$ relative to the characteristic line without the Maxwell term correction read pulse, and is made to match the standard Maxwell term phase error characteristic line.

By appending a $4^{th}$ Maxwell term correction read pulse $MTCP_4$, a characteristic line of a Maxwell term phase error in a $4^{th}$ shot is lowered by a bias phase error $\phi_c(4)$ relative to the characteristic line without the Maxwell term correction read pulse, and is made to match the standard Maxwell term phase error characteristic line.

As can be seen from FIG. 3, the Maxwell term phase error which is caused by the data acquisition read gradient and contained in the data $d_{11}$–$d_{44}$ filling out the k-space KS smoothly varies along a line from the $1^{st}$ row to the $16^{th}$ row in the direction of the phase encoding axis. Thus, the Maxwell term phase error caused by the data acquisition read gradient $r_1$–$r_4$ does not exhibit a large stepped difference between the adjacent echo blocks, and ghost artifacts can be reduced.

It should be noted that the Maxwell phase error shown in FIG. 3 is zero for the $1^{st}$ echo in the $3^{rd}$ shot for acquiring data proximate to a DC component, which is the most important to image reconstruction.

Assume that a data acquisition read gradient corresponding to one echo is a trapezoidal wave, and the trapezoidal wave has a rising/lowering time of $t_{ro}$, a maximum amplitude period of $T_{ro}$ and a maximum amplitude of $G_{ro}$. A Maxwell term phase error $\phi_{ro}$ caused by the data acquisition read gradient is given by:

$$\phi_{ro} = \frac{\gamma Z^2}{2B_0} G_{ro}^2 \left(\frac{2}{3} t_{ro} + T_{ro}\right). \quad (3)$$

Moreover, assume that the positive portion and negative portion of the Maxwell term correction read pulse are each trapezoidal waves, and the trapezoidal waves have a rising/lowering time of $t_c$, a maximum amplitude period of $T_c$ and maximum amplitudes of $+G_c$ and $-G_c$. A Maxwell term phase error $\phi_c$ caused by the Maxwell term correction read pulse is given by:

$$\phi_c = \frac{\gamma Z^2}{B_0} G_c^2 \left(\frac{2}{3} t_c + T_c\right). \quad (4)$$

To make the Maxwell term phase error which is caused by the data acquisition read gradient and contained in the data $d_{11}$–$d_{14}$ filling out the k-space KS smoothly align along a line from the $1^{st}$ row to the $16^{th}$ row in the direction of the phase encoding axis as shown in FIG. 3, a bias phase error $\phi_c(1)$ equal to the Maxwell term phase error $\phi_{ro}$ caused by a data acquisition read gradient corresponding to one echo can be given by the $1^{st}$ Maxwell term correction read pulse $MTCP_1$, a bias phase error $\phi_c(2)$ equal to $(3 \cdot \phi_{ro}/4)$ by the $2^{nd}$ Maxwell term correction read pulse $MTCP_2$, a bias phase error $\phi_c(3)$ equal to $(2 \cdot \phi_{ro}/4)$ by the $3^{rd}$ Maxwell term correction read pulse $MTCP_3$, and a bias phase error $\phi_c(4)$ equal to $(\phi_{ro}/4)$ by the $4^{th}$ Maxwell term correction read pulse $MTCP_4$, resulting in the following equation:

$$\phi_c(n) = \frac{(N-n+1)}{N} \phi_{ro}. \quad (5)$$

From Equations (4) and (5), the following equation can be derived:

$$G_c(n) = \sqrt{\frac{\frac{1}{2} \frac{(N-n+1)}{N} G_{ro}^2 \left(\frac{2}{3} t_{ro} + T_{ro}\right)}{\frac{2}{3} t_c + T_c}}. \quad (6)$$

An n-th Maxwell term correction read pulse $MTCP_n$ can be designed using Equation (6).

Second Embodiment

Figure 4:
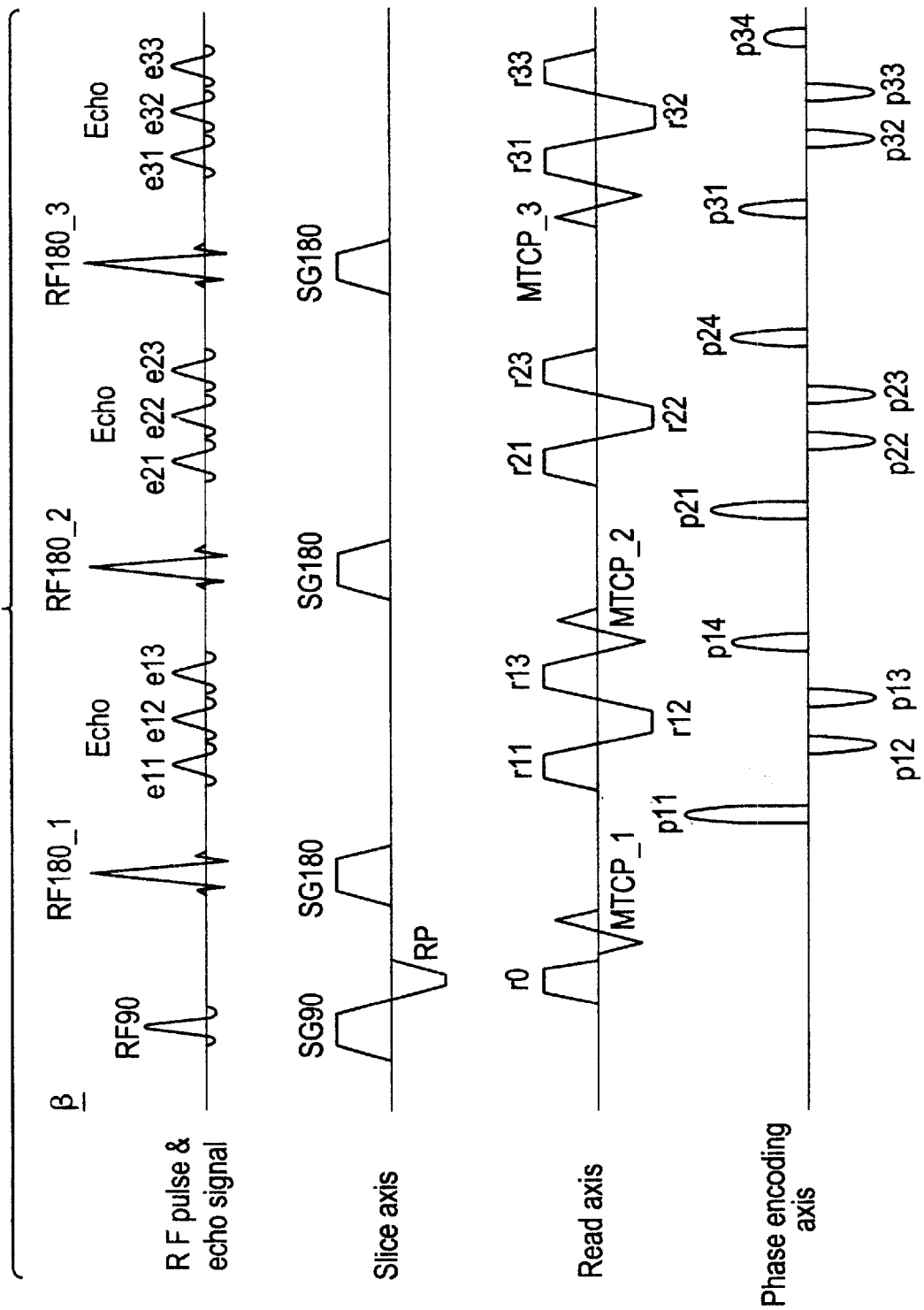
FIG. 4 is a pulse sequence chart of a GRASE technique in accordance with a second embodiment of the invention.

FIG. 4 is a pulse sequence chart of a GRASE technique in accordance with a second embodiment of the present invention.

The GRASE pulse sequence β is generated by the computer 7 so that the following conditions are satisfied:

(1) when a k-space is divided into $1^{st}$ through $9^{th}$ rows in the direction of a phase encoding axis, executing for one shot a pulse sequence which applies three inversion RF pulses per excitation RF pulse and applies a data acquisition read gradient while inverting the gradient to focus three echoes per inversion RF pulse, and collecting data $d_{ji}$ for a $(j+(i-1)\cdot J)$-th row by an i-th echo (i=1–3) for a j-th inversion RF pulse (j=1–3); and (2) appending a j-th Maxwell term correction read pulse, before or after a j-th inversion RF pulse, the j-th Maxwell term correction read pulse having a waveform whose time integral value is zero, and giving a bias phase error such that a Maxwell term phase error which is caused by the data acquisition read gradient and contained in the data $d_{ji}$ filling out the k-space KS smoothly varies from the $1^{st}$ row to the $9^{th}$ row in the direction of the phase encoding axis.

Figure 5:
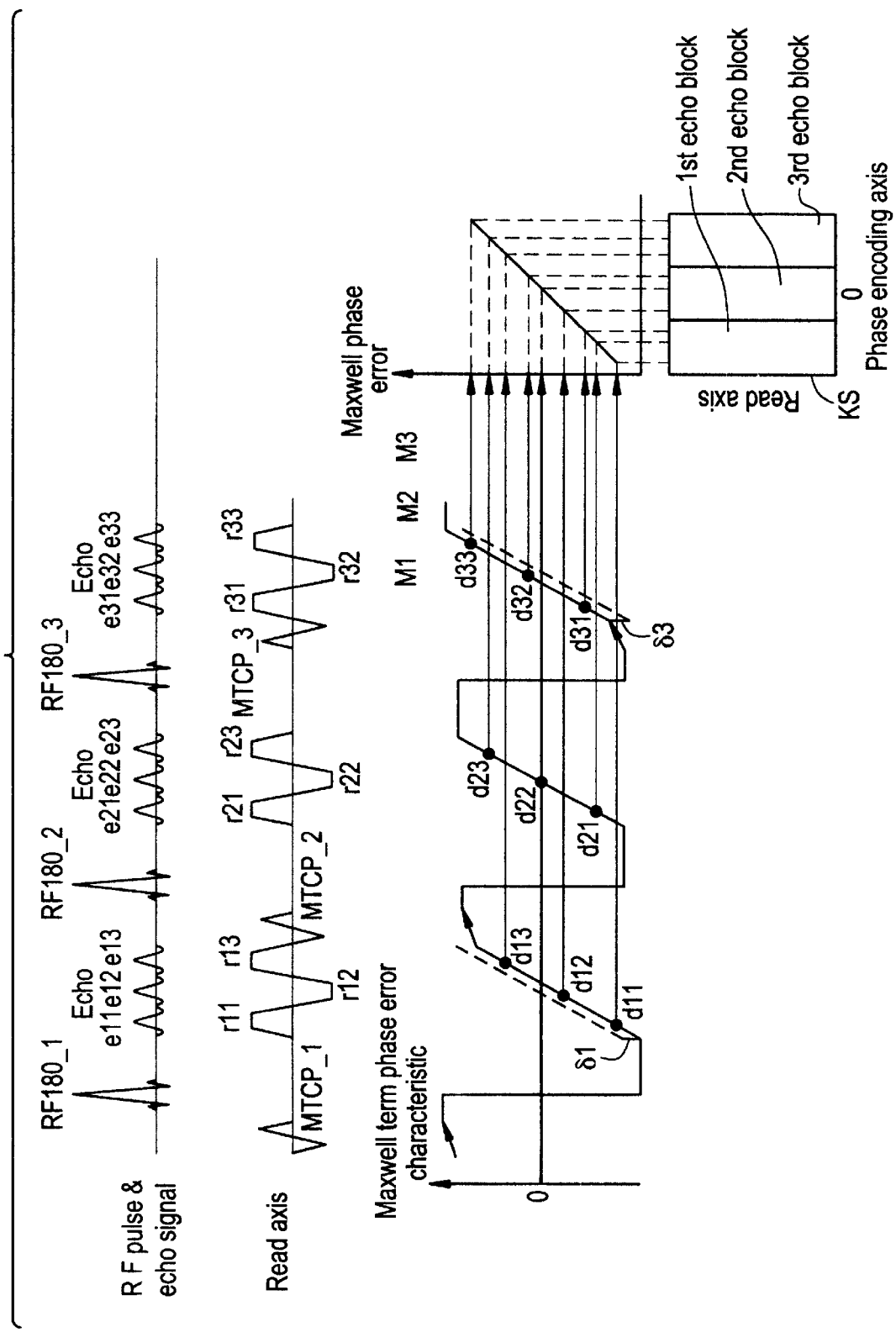
FIG. 5 is diagram illustrating a Maxwell term phase error characteristic caused by a data acquisition read gradient in accordance with the second embodiment.
Figure 6:
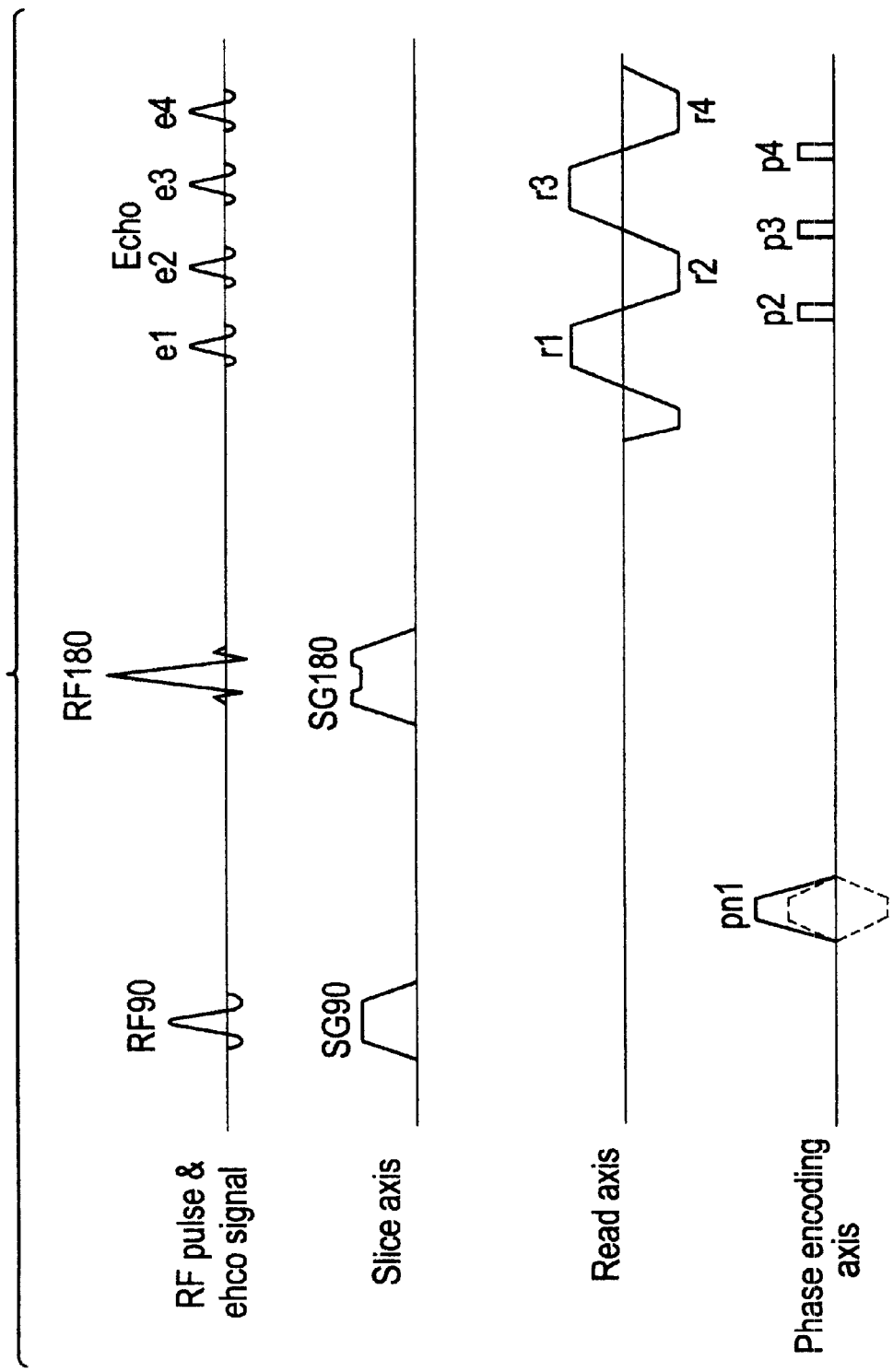
FIG. 6 is a pulse sequence chart of a conventional EPI technique.
Figure 7:
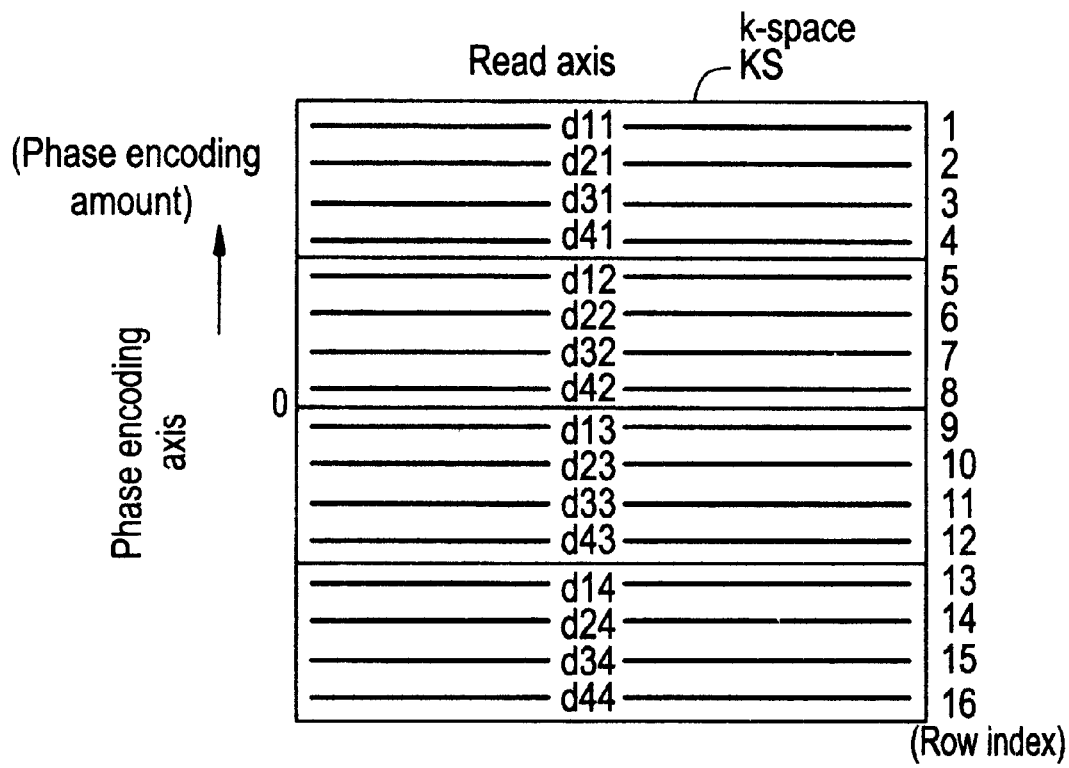
FIG. 7 is a diagram illustrating a trajectory of data collection in a k-space by the EPI pulse sequence.
Figure 8:
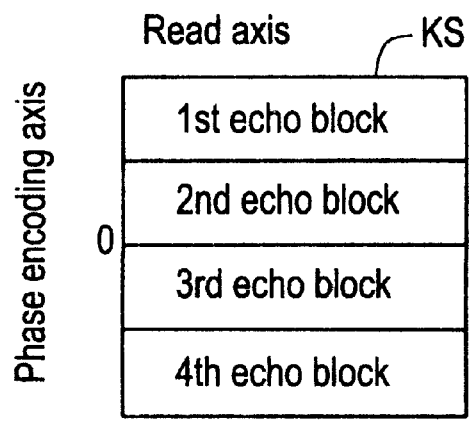
FIG. 8 is a diagram illustrating echo blocks in the k-space by the EPI pulse sequence.
Figure 9:
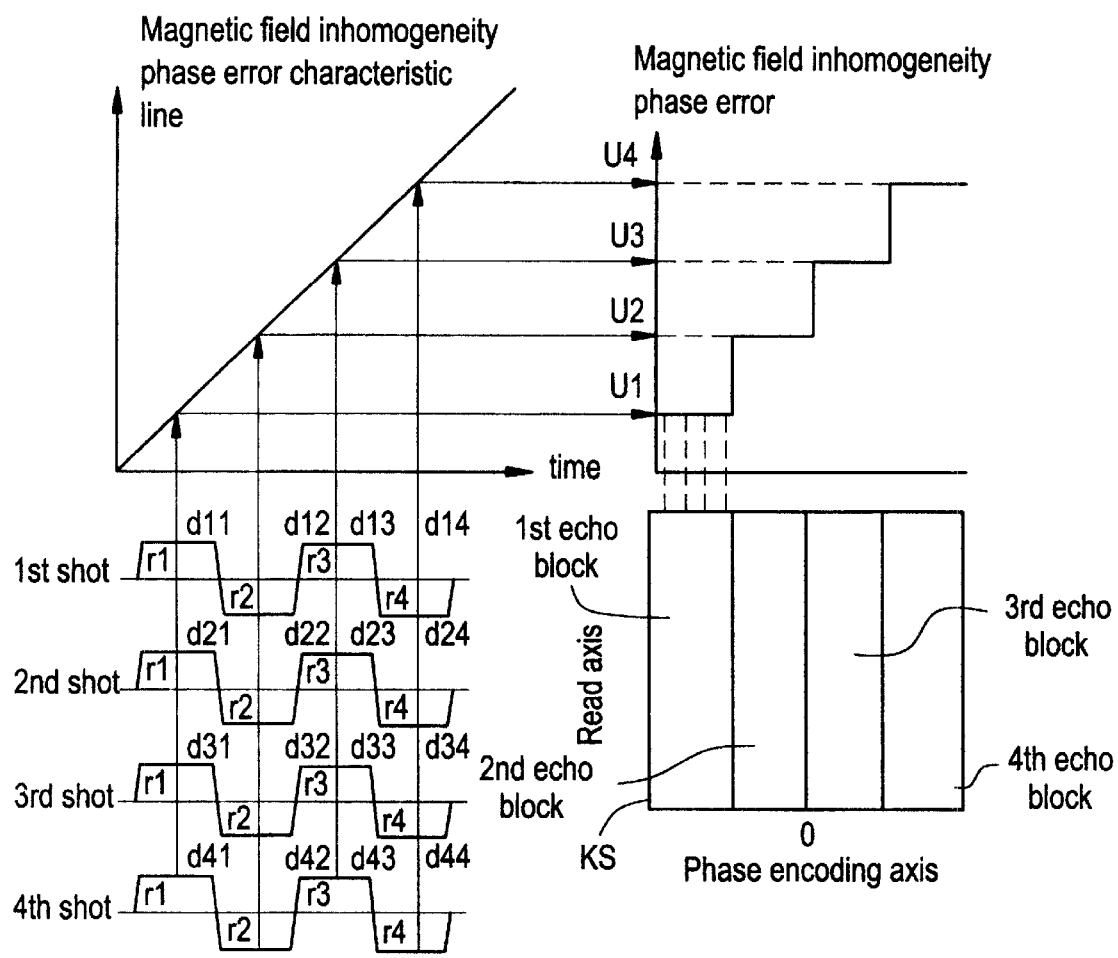
FIG. 9 is a diagram illustrating a phase error characteristic due to magnetic field inhomogeneity without echo shift in the EPI pulse sequence.
Figure 10:
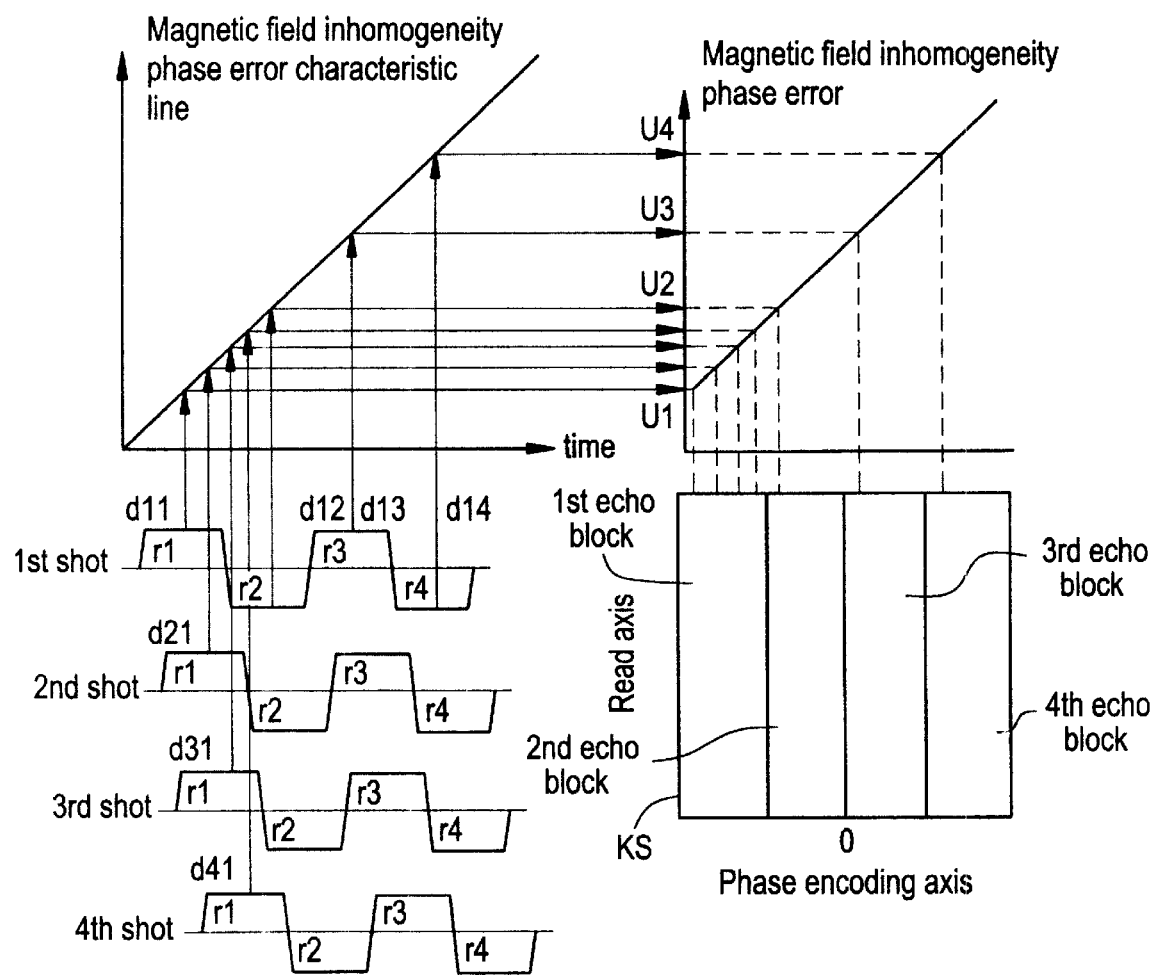
FIG. 10 is a diagram illustrating a phase error characteristic due to magnetic field inhomogeneity with echo shift in the EPI pulse sequence.
Figure 11:
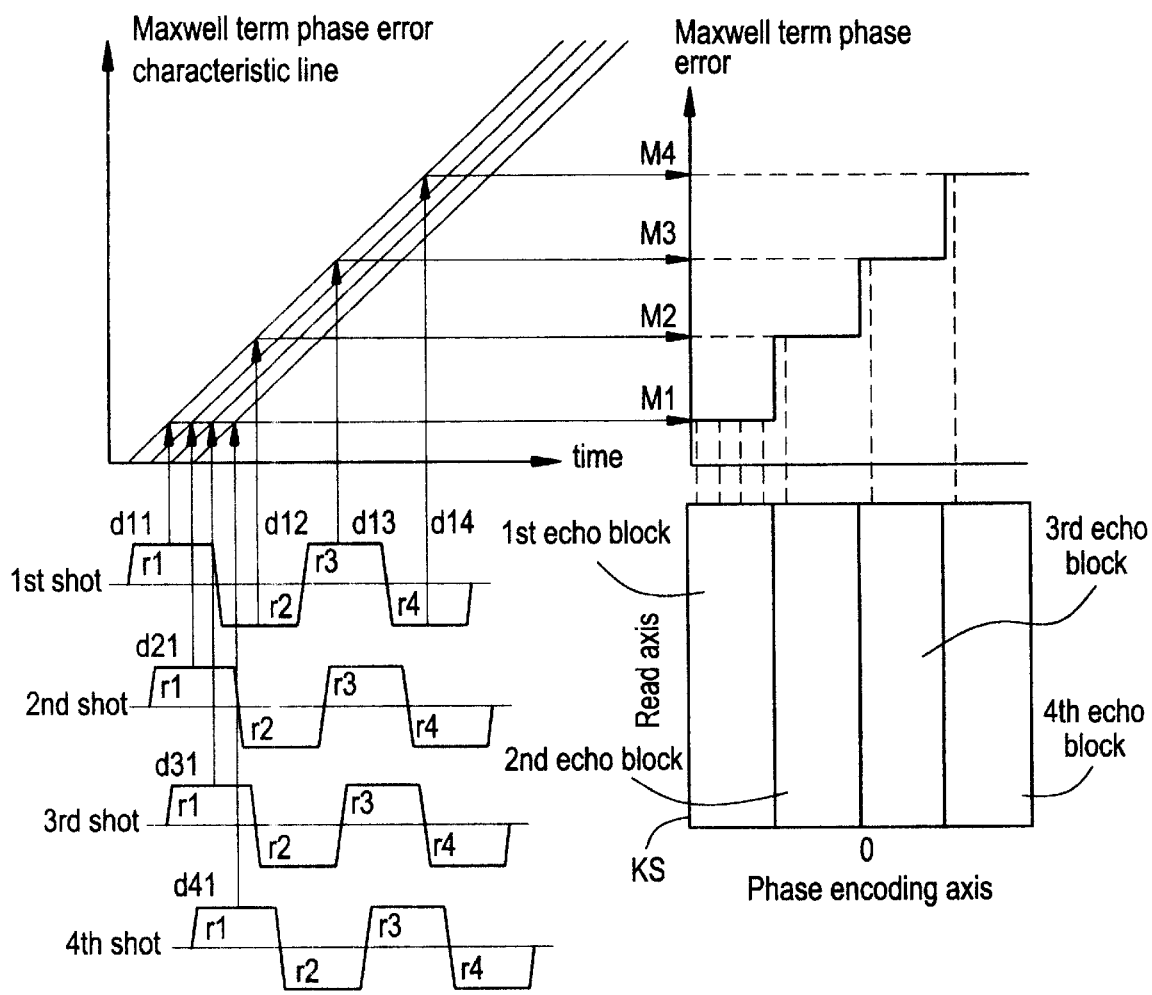
FIG. 11 is a diagram illustrating a Maxwell term phase error characteristic caused by a data acquisition read gradient with echo shift in the conventional EPI pulse sequence.
Figure 12:
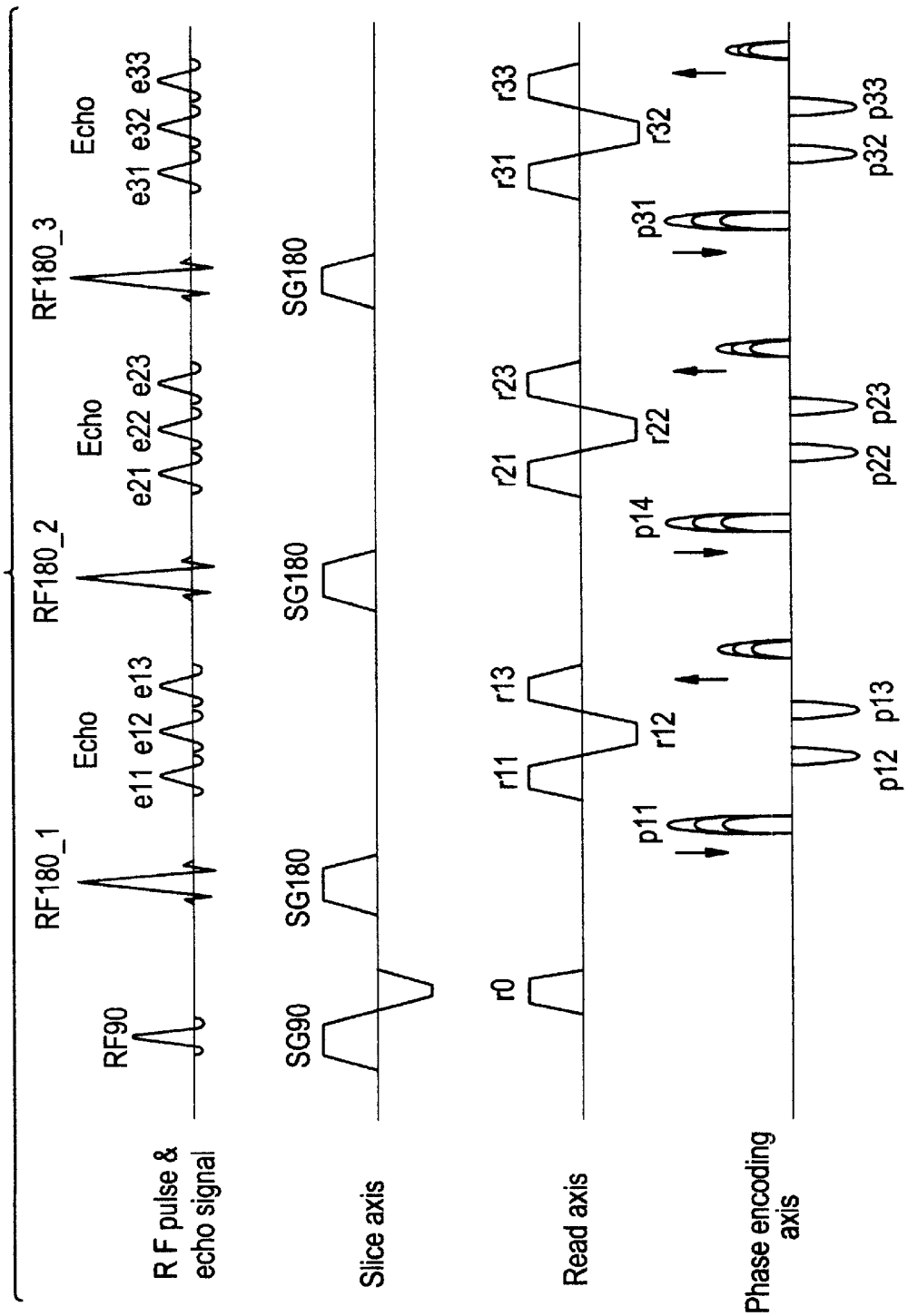
FIG. 12 is a pulse sequence chart of a conventional GRASE technique.
Figure 13:
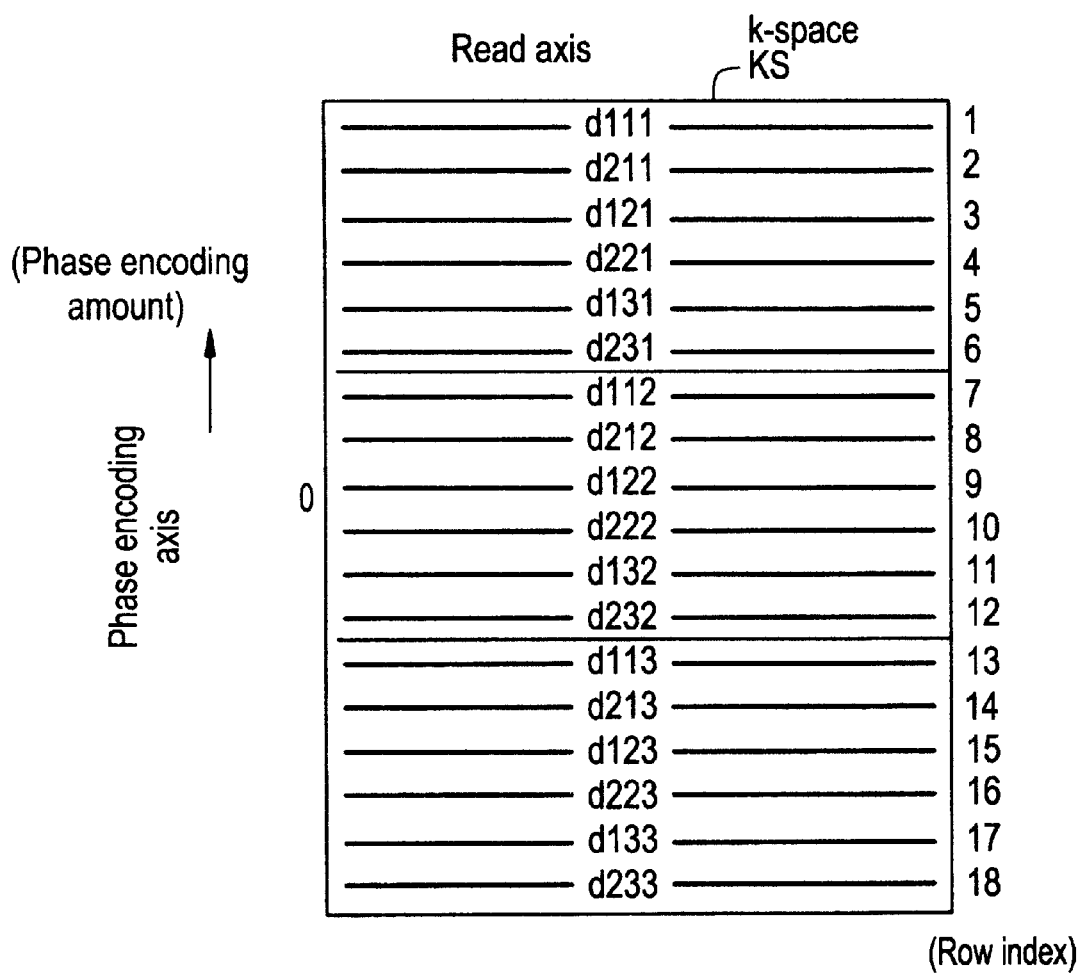
FIG. 13 is a diagram illustrating a trajectory of data collection in a k-space by the GRASE pulse sequence.
Figure 14:
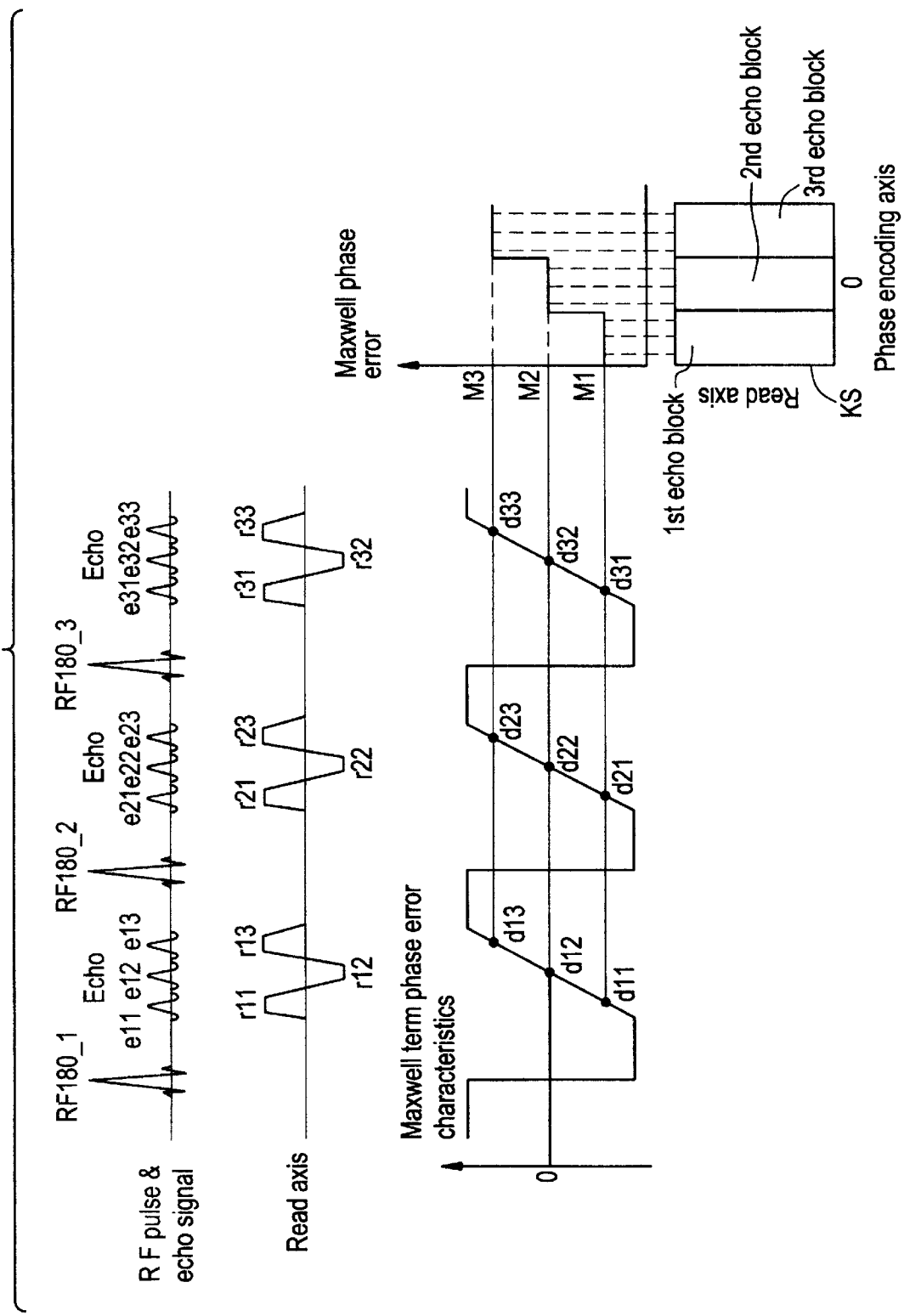
FIG. 14 is a diagram illustrating a Maxwell term phase error characteristic caused by a data acquisition read gradient in the conventional GRASE pulse sequence.

FIG. 5 is a diagram illustrating a Maxwell term phase error which is caused by the data acquisition read gradient and contained in the data $d_{ji}$ obtained by the GRASE pulse sequence of the second embodiment.

A $1^{st}$ Maxwell term correction read pulse MTCP_1 is appended before a $1^{st}$ inversion pulse RF180_1, to lower a Maxwell term phase error characteristic caused by a data acquisition read gradient $r_{11}$–$r_{13}$ corresponding to the $1^{st}$ inversion pulse RF180_1, by $\delta_1$ relative to the characteristic without the $1^{st}$ Maxwell term correction read pulse MTCP_1.

Next, a $2^{nd}$ Maxwell term correction read pulse MTCP_2 is appended before a $2^{nd}$ inversion pulse RF180_2, and the Maxwell term phase error characteristic, which has been lowered by $G_{c1}$ by appending the $1^{st}$ Maxwell term correction read pulse MTCP_1, is restored to the original level. Therefore, the Maxwell term phase error characteristic which is caused by a data acquisition read gradient $r_{21}$–$r_{23}$ corresponding to the $2^{nd}$ inversion pulse RF180_2 is unchanged (i.e. remains at the same level as that without a Maxwell term correction read pulse).

Then, a $3^{rd}$ Maxwell term correction read pulse MTCP_3 is appended before a $3^{rd}$ inversion pulse RF180_3, to raise the Maxwell term phase error characteristic caused by a data acquisition read gradient $r_{31}$–$r_{33}$ corresponding to the $3^{rd}$ inversion pulse RF180_3, by $\delta_3$ relative to the characteristic without the $3^{rd}$ Maxwell term correction read pulse.

As can be seen from FIG. 5, the Maxwell term phase error which is caused by the data acquisition read gradient and contained in the data $d_{11}$–$d_{33}$ filling out the k-space KS smoothly varies along a line from the $1^{st}$ row to the $9^{th}$ row in the direction of the phase encoding axis. Thus, the Maxwell term phase error caused by the data acquisition read gradient does not exhibit a large stepped difference between the adjacent echo blocks, and ghost artifacts can be reduced.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:
pulse sequence generating means for generating a pulse sequence for collecting data;
data collecting means for executing said generating pulse sequence to collect data;
means for applying a static magnetic field to a slice of an object being examined of which said data is collected; and
image producing means for reconstructing an image from said collected data; wherein
said pulse sequence generating means generates a pulse sequence for a particular shot so that the following conditions are satisfied:
when a k-space is divided into a plurality of rows in direction of a phase encoding axis, repeating for each shot a pulse sequence which applies a data acquisition read gradient while inverting the gradient to focus one or more resulting echoes per inversion of an RF pulse, and collecting data of said slice for filling out said k-space; and
appending a bipolar correction pulse between a 90° RF pulse and an inverstion 180° RF pulse for each shot, wherein said bipolar correction pulse is varied for each excitation, said bipolar correction pulse having a waveform whose time integral value is zero, and providing a bias phase error such that a phase error which is caused by the data acquisition read gradient and contained in the data of said slice filling out the k-space smoothly varies from row to row in direction of the phase encoding axis including in a case of a shot taken as reference, and appending no bipolar correction pulse only to that shot.

2. The apparatus of claim 1, wherein the following conditions are also satisfied:
appending said bipolar correction pulse such that said phase error caused by said data acquisition read gradient and contained in data of, or proximate to, a DC component in the k-space is equal to, or proximate to zero.

3. An MRI apparatus comprising:
pulse sequence generating means for generating a pulse sequence for collecting data;
data collecting means for executing said generated pulse sequence to collect data;
means for applying a static magnetic field to a slice of an object being examined of which said data is collected; and
image producing means for reconstructing an image from said collected data; wherein
said pulse sequence generating means generates a pulse sequence for a particular shot so that the following conditions are satisfied:
when a k-space is divided into a plurality of rows in direction of a phase encoding axis, repeating for each shot a pulse sequence whch applies a plurality of inversion RF pulses per excitation RF pulse and applies a data acquisition read gradient while inverting the gradient to focus one or more resulting echoes per inversion of RF pulse, and collecting data of said slice for filling out the k-space; and
appending a bipolar correction pulse between an excitation 90° RF pulse and an inversion 180° RF pulse and after said inversion 180° RF pulse, wherein said bipolar correctipn pulse is varied for each excitation, said bipolar correction pulse having a waveform whose time integral value is zero, and providing a bias phase error such that a phase error caused by said data acquisition read gradient and contained in said data of said slice filling out the k-space, smoothly varies from row to row in direction of said phase encoding axis, including in a case of a shot taken as a reference, and appending no bipolar correction pulse only to that shot.

4. The apparatus of claim 3, wherein the following conditions are also satisfied:
appending said bipolar correction pulse such that the phase error caused by the data acquisition read gradient and contained in data of, or proximate to, a DC component in said k-space is equal to, or proximate to, zero.

5. An NMR data collection method comprising the steps of:
applying a static magnetic field to a slice of an object being examined of which data is collected;
determining a pulse sequence for each shot so that the following conditions are satisfied:
when a k-space is divided into a plurality of rows in direction of a phase encoding axis, repeating for each shot a pulse sequence which applies a data acquisition read gradient while inverting the gradient for focus, one or more resulting echoes per inversion RF pulse, and collecting data of said slice for filling out said k-space; and appending a bipolar correction pulse between a 90° RF pulse and an inversion 180° RF pulse for each shot, wherein said bipolar correction pulse is varied for each excitation, said bipolar correction pulse having a waveform whose time integral is zero, and providing a bias phase error such that a phase error caused by said data acquisition read gradient and contained in said data filling out said k-space smoothly varies from one row to another row in direction of said phase encoding axis, including, in case of a shot taken as a reference, and appending no bipolar correction pulse only to that shot; and executing said pulse sequence to collect NMR data.

6. The method of claim 5, further comprising the step of reconstructing an image from said collected data.

7. The method of claim 5, further comprising the condition of:

appending said bipolar correction pulse such that said phase error caused by said data acquisition read gradient and contained in data of, or proximate to, a DC component in said k-space is equal to, or proximate to, zero.

8. The method of claim 7, further comprising the step of reconstructing an image from said collected data.

9. An NMR data collecting method comprising the steps of:

applying a static magnetic field to a slice of an object being examined of which data is collected;

determining a pulse sequence for each shot so that the following conditions are satisfied:

when a k-space is divided into a plurality of rows in direction of a phase encoding axis, repeating for each shot a pulse sequence which applies a plurality of inversion RF pulses per excitation RF pulse and applies a data acquisition read gradient while inverting said gradient to focus one or more resulting echoes per inversion RF pulse, and collecting data of said slice for filling out the k-space; and appending a bipolar correction pulse between an excitation 90° RF pulse and an inversion 180° RF pulse and after said inversion 180° RF pulse, wherein said bipolar corection pulse is varied for each excitation, said bipolar correction pulse having a waveform whose time integral value is zero, and providing a bias phase error such that a phase error caused by said data acquisition read gradient and contained in said data filling out said k-space smoothly varies from one row to another in direction of said phase encoding axis, including, in case of a shot taken as a reference, and appending no bipolar correction pulse only to that shot; and executing said pulse sequence to collect NMR data.

10. The method of claim 9, further comprising the step of reconstructing an image from said collected data.

11. The method of claim 9, further comprising the condition of:

appending said bipolar correction pulse such that said phase error caused by said data acquisition read gradient and contained in data of, or proximate to, a DC component in said k-space, is equal to, or proximate to, zero.

12. The method of claim 11, further comprising the step of reconstructing an image from said collected data.

* * * * *